United States Patent
Deng et al.

(10) Patent No.: US 10,473,990 B2
(45) Date of Patent: Nov. 12, 2019

(54) MANUFACTURE METHOD OF LOW TEMPERATURE POLY-SILICON ARRAY SUBSTRATE

(71) Applicant: Wuhan China Star Optoelectronics Technology Co., Ltd., Wuhan (CN)

(72) Inventors: Si Deng, Wuhan (CN); Yuan Guo, Wuhan (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/129,767

(22) Filed: Sep. 12, 2018

(65) Prior Publication Data

US 2018/0373076 A1    Dec. 27, 2018

Related U.S. Application Data

(63) Continuation of application No. 15/111,822, filed on Jul. 15, 2016, now Pat. No. 10,101,620.

(30) Foreign Application Priority Data

Jan. 28, 2016    (CN) .......................... 2016 1 0060851

(51) Int. Cl.
*H01L 21/00* (2006.01)
*G02F 1/1362* (2006.01)
(Continued)

(52) U.S. Cl.
CPC ...... *G02F 1/1362* (2013.01); *H01L 21/02595* (2013.01); *H01L 21/02667* (2013.01); *H01L 21/77* (2013.01); *H01L 27/127* (2013.01); *H01L 27/1288* (2013.01); *H01L 29/78621* (2013.01); *H01L 29/78633* (2013.01); *G02F 1/133516* (2013.01); *G02F 1/136209* (2013.01);
(Continued)

(58) Field of Classification Search
CPC ......... G02F 1/133621; G02F 1/133514; G02F 1/133516; G02F 1/133345; G02F 1/1368; G02F 1/1341; G02F 1/13394; G02F 1/133512; G02F 2001/133562; G02F 2001/134372; G02F 2203/05; G02F 1/134363; G02F 1/136209; G02F 2001/133614; G02F 2202/36; G02F 2202/02; G02F 2001/133357; G02F 2001/13685; G02F 2201/086; G02F 2203/055; H01L 29/78621; H01L 29/78633; H01L 27/1222; H01L 29/66757; H01L 27/127; H01L 27/1248
USPC ............................................................ 438/30
See application file for complete search history.

(56) References Cited

U.S. PATENT DOCUMENTS

| 6,160,268 A * | 12/2000 | Yamazaki ........... H01L 27/1214 257/57 |
| 6,740,938 B2 * | 5/2004 | Tsunoda .............. H01L 27/1214 257/365 |
| 2013/0168683 A1 * | 7/2013 | Seo ................... H01L 29/66765 257/66 |

* cited by examiner

*Primary Examiner* — Vu A Vu
(74) *Attorney, Agent, or Firm* — Leong C. Lei

(57) ABSTRACT

A manufacture method of a low temperature poly-silicon array substrate is provided. A halftone mask is utilized to realize a patterning process applied to a polysilicon layer and an N type heavy doping process of a polysilicon section of an NMOS region. In comparison with prior art, one mask is saved, and thus, the production cost is reduced, and a low temperature poly-silicon array substrate manufactured with such a process possesses excellent electronic property.

16 Claims, 10 Drawing Sheets

(51) Int. Cl.
*H01L 21/77* (2017.01)
*H01L 21/02* (2006.01)
*H01L 29/786* (2006.01)
*H01L 27/12* (2006.01)
G02F 1/1335 (2006.01)
G02F 1/1368 (2006.01)

(52) U.S. Cl.
CPC ............ *G02F 2001/13685* (2013.01); *G02F 2001/136236* (2013.01); *G02F 2001/136245* (2013.01); *G02F 2201/40* (2013.01); *G02F 2202/104* (2013.01)

MANUFACTURE METHOD OF LOW TEMPERATURE POLY-SILICON ARRAY SUBSTRATE

CROSS REFERENCE TO RELATED APPLICATIONS

This is a continuation application of co-pending U.S. patent application Ser. No. 15/111,822, filed on Jul. 15, 2016, which is a national stage of PCT Application No. PCT/CN2016/082717, filed on May 20, 2016, claiming foreign priority of Chinese Patent Application No. 201610060851.4, filed on Jan. 28, 2016.

FIELD OF THE INVENTION

The present invention relates to a display panel technology field, and more particularly to a manufacture method of low temperature poly-silicon array substrate.

BACKGROUND OF THE INVENTION

With the development of display technology, the flat panel device, such as liquid crystal display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions.

Generally, the liquid crystal display panel comprises a color filter (CF) substrate, a thin film transistor (TFT) substrate, liquid crystal (LC) sandwiched between the CF substrate and TFT substrate and sealant. The formation process generally comprises: a forepart array process (thin film, photo, etching and stripping), a middle cell process (lamination of the TFT substrate and the CF substrate) and a post module assembly process (attachment of the driving IC and the printed circuit board). The forepart array process is mainly to form the TFT substrate for controlling the movement of the liquid crystal molecules; the middle cell process is mainly to add liquid crystal between the TFT substrate and the CF substrate; the post module assembly process is mainly the driving IC attachment and the integration of the printed circuit board. Thus, the liquid crystal molecules are driven to rotate and display pictures.

Low temperature poly-silicon (LTPS) is a kind of liquid crystal display technology which has been widely applied in the small, medium size electronic products. The electron mobility of the traditional amorphous silicon material is about 0.5-1.0 cm2/V·S but the electron mobility of the low temperature poly-silicon can reach up to 30-300 cm2/V·S. Therefore, the low temperature poly-silicon display has many advantages of high resolution, fast response speed and high aperture ratio.

However, on the other hand, the volume of the LTPS semiconductor element is small and the integration is high. The manufacture process of the entire LTPS array substrate is complicated, and the production cost is higher.

In the present manufacture process of the LTPS array substrate, the patterning of the polysilicon (Poly-si), the channel doping of the NMOS (Negative channel Metal Oxide Semiconductor) element and the N type heavy doping of the NMOS element (N+doping) respectively needs a mask, and the specific steps are:

as shown in FIG. 1, coating a photoresist layer 200 on the polysilicon layer, and after employing a first mask to implement exposure, development to the photoresist layer 200, and the remaining photoresist layer 200 is employed for shielding to etch the polysilicon layer to obtain a first polysilicon section 300 in the NMOS region and a second polysilicon section 400 in the PMOS (Positive channel Metal Oxide Semiconductor) region;

as shown in FIG. 2, coating a photoresist layer 500 on the on the first polysilicon section 300 and the second polysilicon section 400, and after employing a second mask to implement exposure, development to the photoresist layer 500, the second polysilicon section 400 of the PMOS region is shielded with the remaining photoresist layer 500, and implementing channel doping to the first polysilicon section 300;

as shown in FIG. 3, coating a photoresist layer 600 on the first polysilicon section 300 and the second polysilicon section 400, and after employing a second mask to implement exposure, development to the photoresist layer 600, the second polysilicon section 400 of the PMOS region and the middle region of the first polysilicon section 300 of the NMOS region are shielded with the remaining photoresist layer 600, and implementing N type heavy doping to two ends of the first polysilicon section 300.

The aforesaid manufacture processes require three masks for accomplishment. The process is complicated, and the production cost is high. Therefore, there is a need to provide a manufacture method of a low temperature poly-silicon array substrate to solve the technical issue.

SUMMARY OF THE INVENTION

An objective of the present invention is to provide a manufacture method of a low temperature poly-silicon array substrate. A halftone mask is utilized to realize the pattern process to the polysilicon layer and the N type heavy doping process of the polysilicon section of the NMOS region. In comparison with prior art, one mask is eliminated, and thus, the production cost is reduced.

For realizing the aforesaid objectives, the present invention provides a manufacture method of a low temperature poly-silicon array substrate, comprising steps of:

step 1, providing a substrate, and defining a NMOS region and a PMOS region on the substrate, and depositing a first metal layer on the substrate, and patterning the first metal layer to obtain a first light shielding layer in the NMOS region and a second light shielding layer in the PMOS region;

step 2, forming a buffer layer on the first light shielding layer, the second light shielding layer and the substrate, and depositing an amorphous silicon layer on the buffer layer, and employing a low temperature crystallization process to convert the amorphous silicon layer into a polysilicon layer, and employing a mask to implement a channel doping to the polysilicon layer in the NMOS region;

step 3, coating a photoresist layer on the polysilicon layer, and after employing a halftone mask to implement exposure, development to the photoresist layer, a first photoresist layer in the NMOS region and a second photoresist layer in the PMOS region are obtained, and the first photoresist layer comprises a thick layer region in the middle and thin layer regions at two sides of the thick layer region, and a thickness of the second photoresist layer is uniform, and thicknesses of the thick layer region of the first photoresist layer and the second photoresist layer are equal;

employing the first photoresist layer and the second photoresist layer for shielding to etch the polysilicon layer to respectively obtain a first polysilicon section in the NMOS region and a second polysilicon section in the PMOS region;

employing a dry etching apparatus to implement ashing treatment to the first photoresist layer and the second photoresist layer to completely remove the thin layer regions at the two sides on the first photoresist layer, and meanwhile, to make the thicknesses of the thick layer of the first photoresist layer and the second photoresist layer thinner;

employing remained thick layer region on the first photoresist layer and the second photoresist layer to be a mask to implement N type heavy doping to the two sides of the first polysilicon section to obtain two N type heavy doping regions.

The method further comprises steps of:

step 4, depositing a gate isolation layer on the first polysilicon section, the second polysilicon section and the buffer layer, and depositing a second metal layer on the gate isolation layer, and patterning the second metal layer to obtain a first gate and a second gate correspondingly above the first polysilicon section and the second polysilicon section, respectively;

employing the first gate to be a mask to implement N type light doping to the first polysilicon section to obtain two N type light doping regions respectively at inner sides of the two N type heavy doping regions, and a first channel region is formed in a region between the two N type heavy doping regions on the first polysilicon section;

step 5, employing a mask to implement P type heavy doping to two sides of the second polysilicon section to obtain two P type heavy doping regions, and a second channel region is formed in a region between the two P type heavy doping regions on the second polysilicon section;

step 6, depositing an interlayer insulation layer on the first gate, the second gate and the gate isolation layer, and patterning the interlayer insulation layer and the gate isolation layer to obtain a first via above the N type heavy doping region and a second via above the P type heavy doping region, and then implementing dehydrogenation and activation treatments to the interlayer insulation layer;

step 7, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second rain respectively contact with the P type heavy doping region through the second via;

step 8, forming a flat layer on the first source, the first drain, the second source, the second drain and the interlayer insulation layer, and patterning the flat layer to obtain a third via above the first drain;

step 9, depositing a first transparent conductive oxide layer on the flat layer, and patterning the first transparent conductive oxide layer to obtain a common electrode;

step 10, depositing a passivation protective layer on the common electrode and the flat layer, and the passivation protective layer covers the third via on the flat layer, and then patterning the passivation protective layer to obtain a fourth via at a bottom of the third via on the passivation protective layer;

step 11, depositing a second transparent conductive oxide layer on the passivation protective layer, and patterning the second transparent conductive oxide layer to obtain a pixel electrode, and the pixel electrode contacts with the first drain through the fourth via.

In the step 2, the low temperature crystallization process is excimer laser annealing or metal-induced lateral crystallization.

In the step 2, a specific operation of channel doping is: coating a photoresist layer on the polysilicon layer, and employing a mask to implement exposure, development to the photoresist layer, and after removing the photoresist layer in the NMOS region, implementing P type light doping to the polysilicon layer in the entire NMOS region.

In the step 6, rapid thermal annealing is employed to implement the dehydrogenation and activation treatments to the interlayer insulation layer.

The substrate is a glass substrate; a material of the first metal layer, the second metal layer and the third metal layer is a stack combination of one or more of molybdenum, titanium, aluminum and copper; the buffer layer, the gate isolation layer, the interlayer insulation layer and the passivation protective layer are silicon oxide layers, silicon nitride layers or composite layers superimposed with silicon oxide layers and silicon nitride layers; the flat layer is organic photoresist material.

A material of the first transparent conductive oxide layer and the second transparent conductive oxide layer is a metal oxide.

The metal oxide is indium tin oxide, aluminum tin oxide, aluminum zinc oxide or indium germanium zinc oxide.

The ion doped by the N type heavy doping and the N type light doping is phosphorus ion or arsenic ion.

The ion doped by the P type heavy doping and the P type light doping is boron ion or gallium ion.

The present invention further provides a manufacture method of a low temperature poly-silicon array substrate, comprising steps of:

step 1, providing a substrate, and defining a NMOS region and a PMOS region on the substrate, and depositing a first metal layer on the substrate, and patterning the first metal layer to obtain a first light shielding layer in the NMOS region and a second light shielding layer in the PMOS region;

step 2, forming a buffer layer on the first light shielding layer, the second light shielding layer and the substrate, and depositing an amorphous silicon layer on the buffer layer, and employing a low temperature crystallization process to convert the amorphous silicon layer into a polysilicon layer, and employing a mask to implement a channel doping to the polysilicon layer in the NMOS region;

step 3, coating a photoresist layer on the polysilicon layer, and after employing a halftone mask to implement exposure, development to the photoresist layer, a first photoresist layer in the NMOS region and a second photoresist layer in the PMOS region are obtained, and the first photoresist layer comprises a thick layer region in the middle and thin layer regions at two sides of the thick layer region, and a thickness of the second photoresist layer is uniform, and thicknesses of the thick layer region of the first photoresist layer and the second photoresist layer are equal;

employing the first photoresist layer and the second photoresist layer for shielding to etch the polysilicon layer to respectively obtain a first polysilicon section in the NMOS region and a second polysilicon section in the PMOS region;

employing a dry etching apparatus to implement ashing treatment to the first photoresist layer and the second photoresist layer to completely remove the thin layer regions at the two sides on the first photoresist layer, and meanwhile, to make the thicknesses of the thick layer of the first photoresist layer and the second photoresist layer thinner; employing remained thick layer region on the first photoresist layer and the second photoresist layer to be a mask to implement N type heavy doping to the two sides of the first polysilicon section to obtain two N type heavy doping regions;

the method further comprising steps of:

step 4, depositing a gate isolation layer on the first polysilicon section, the second polysilicon section and the buffer layer, and depositing a second metal layer on the gate isolation layer, and patterning the second metal layer to obtain a first gate and a second gate correspondingly above the first polysilicon section and the second polysilicon section, respectively;

employing the first gate to be a mask to implement N type light doping to the first polysilicon section to obtain two N type light doping regions respectively at inner sides of the two N type heavy doping regions, and a first channel region is formed in a region between the two N type heavy doping regions on the first polysilicon section;

step 5, employing a mask to implement P type heavy doping to two sides of the second polysilicon section to obtain two P type heavy doping regions, and a second channel region is formed in a region between the two P type heavy doping regions on the second polysilicon section;

step 6, depositing an interlayer insulation layer on the first gate, the second gate and the gate isolation layer, and patterning the interlayer insulation layer and the gate isolation layer to obtain a first via above the N type heavy doping region and a second via above the P type heavy doping region, and then implementing dehydrogenation and activation treatments to the interlayer insulation layer;

step 7, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second rain respectively contact with the P type heavy doping region through the second via;

step 8, forming a flat layer on the first source, the first drain, the second source, the second drain and the interlayer insulation layer, and patterning the flat layer to obtain a third via above the first drain;

step 9, depositing a first transparent conductive oxide layer on the flat layer, and patterning the first transparent conductive oxide layer to obtain a common electrode;

step 10, depositing a passivation protective layer on the common electrode and the flat layer, and the passivation protective layer covers the third via on the flat layer, and then patterning the passivation protective layer to obtain a fourth via at a bottom of the third via on the passivation protective layer;

step 11, depositing a second transparent conductive oxide layer on the passivation protective layer, and patterning the second transparent conductive oxide layer to obtain a pixel electrode, and the pixel electrode contacts with the first drain through the fourth via;

wherein in the step 2, the low temperature crystallization process is excimer laser annealing or metal-Induced lateral crystallization;

wherein in the step 2, a specific operation of channel doping is: coating a photoresist layer on the polysilicon layer, and employing a mask to implement exposure, development to the photoresist layer, and after removing the photoresist layer in the NMOS region, implementing P type light doping to the polysilicon layer in the entire NMOS region.

The benefits of the present invention are: the present invention provides a manufacture method of a low temperature poly-silicon array substrate. A halftone mask is utilized to realize the pattern process to the polysilicon layer and the N type heavy doping process of the polysilicon section of the NMOS region. In comparison with prior art, one mask is eliminated, and thus, the production cost is reduced, and the manufactured low temperature poly-silicon array substrate possesses fine electronic property.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
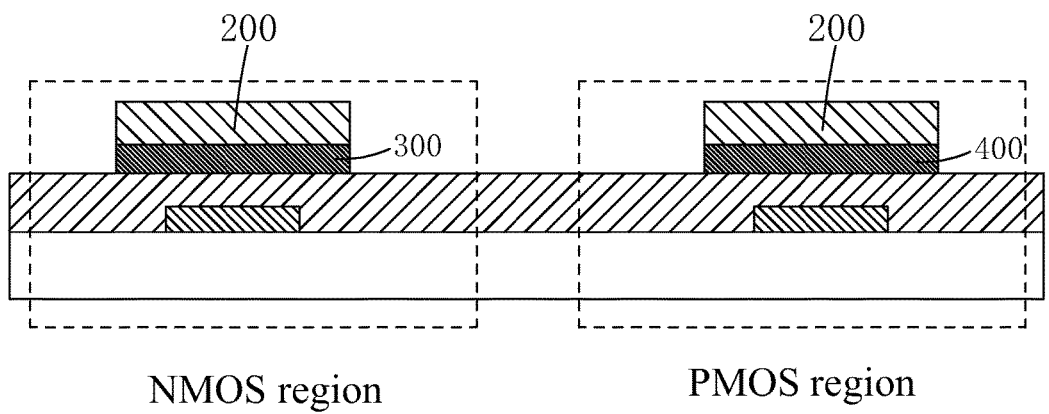
FIG. 1 is a diagram of patterning a polysilicon layer in a manufacture method of a low temperature poly-silicon array substrate according to prior art.
Figure 2:
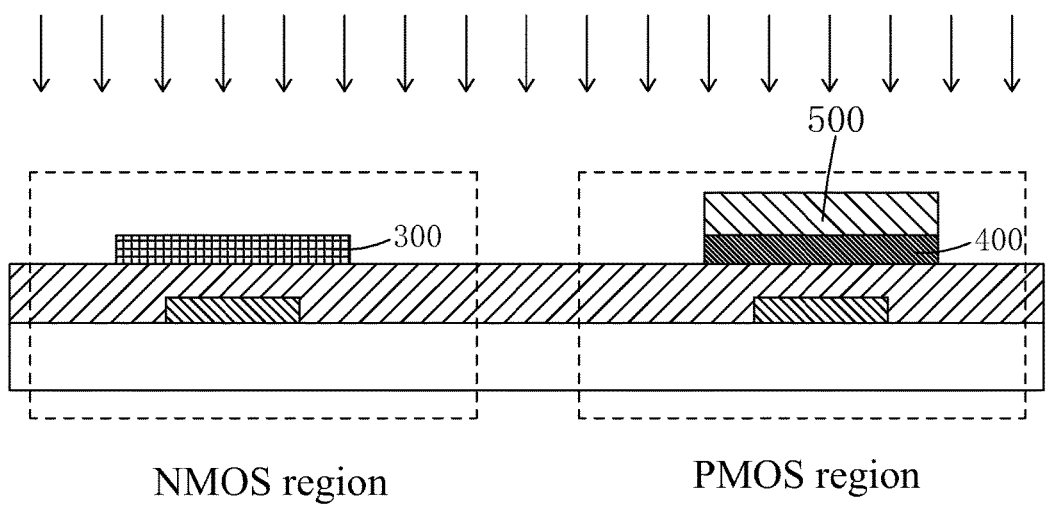
FIG. 2 is a diagram of implementing channel doping to the polysilicon layer in an NMOS region in the manufacture method of the low temperature poly-silicon array substrate according to prior art.
Figure 3:
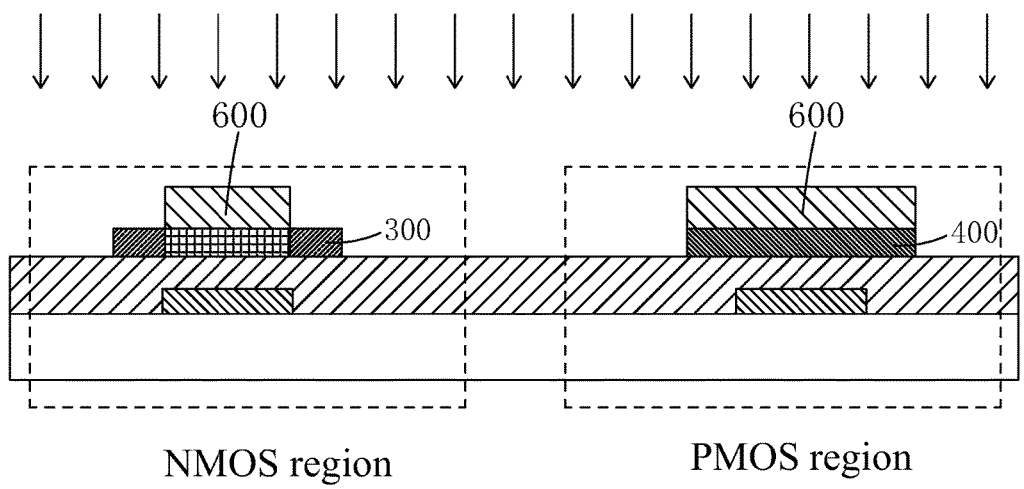
FIG. 3 is a diagram of implementing N type heavy doping to the polysilicon layer in the NMOS region in the manufacture method of the low temperature poly-silicon array substrate according to prior art.
Figure 4:
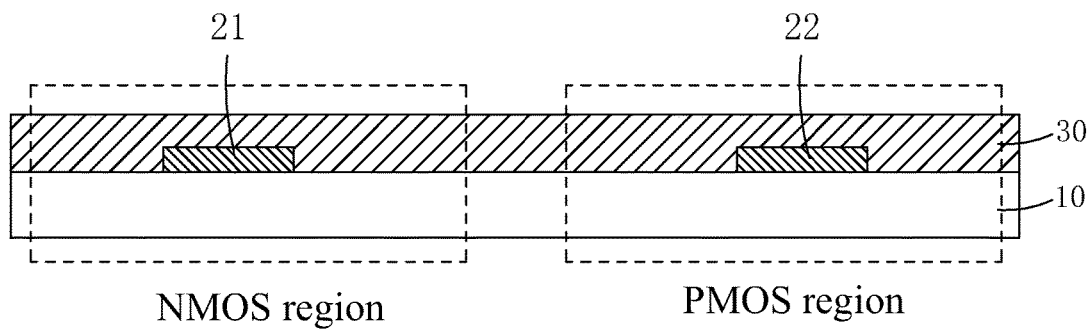
FIG. 4 is a diagram of step 1 of a manufacture method of a low temperature poly-silicon array substrate according to the present invention.
Figure 5:
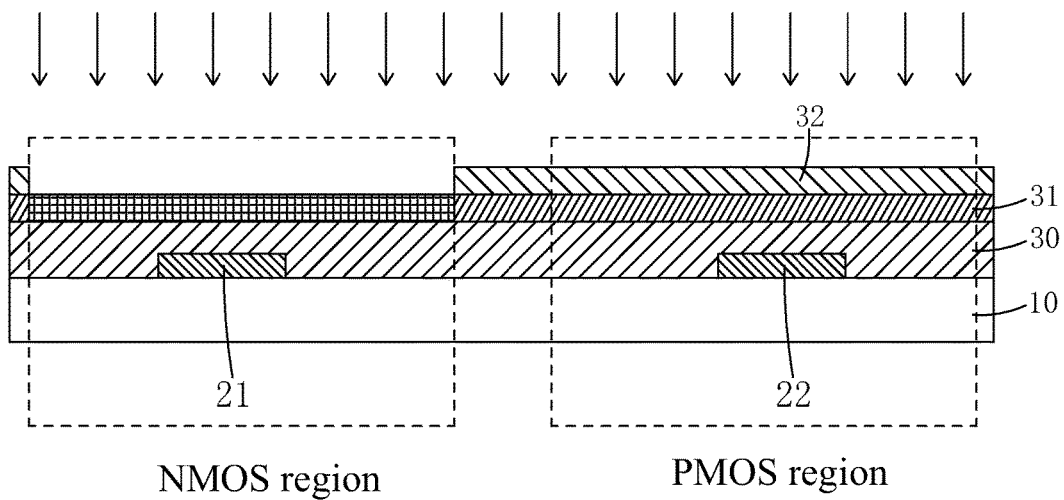
FIG. 5 is a diagram of step 2 of the manufacture method of the low temperature poly-silicon array substrate according to the present invention.

Referring to FIGS. 4-14, the present invention provides a manufacture method of a low temperature poly-silicon array substrate, comprising steps of:

step 1, as shown in FIG. 4, providing a substrate 10, and defining a NMOS region and a PMOS region on the substrate 10, and depositing a first metal layer on the substrate 10, and patterning the first metal layer to obtain a first light shielding layer 21 in the NMOS region and a second light shielding layer 22 in the PMOS region.

step 2, as shown in FIG. 5, forming a buffer layer 30 on the first light shielding layer 21, the second light shielding layer 22 and the substrate 10, and depositing an amorphous silicon layer on the buffer layer 30, and employing a low temperature crystallization process to convert the amorphous silicon layer into a polysilicon layer 31, and employing a mask to implement a channel doping to the polysilicon layer 31 in the NMOS region.

The low temperature crystallization process is excimer laser annealing (ELA) or metal-Induced lateral crystallization (MILC).

Figure 6A:
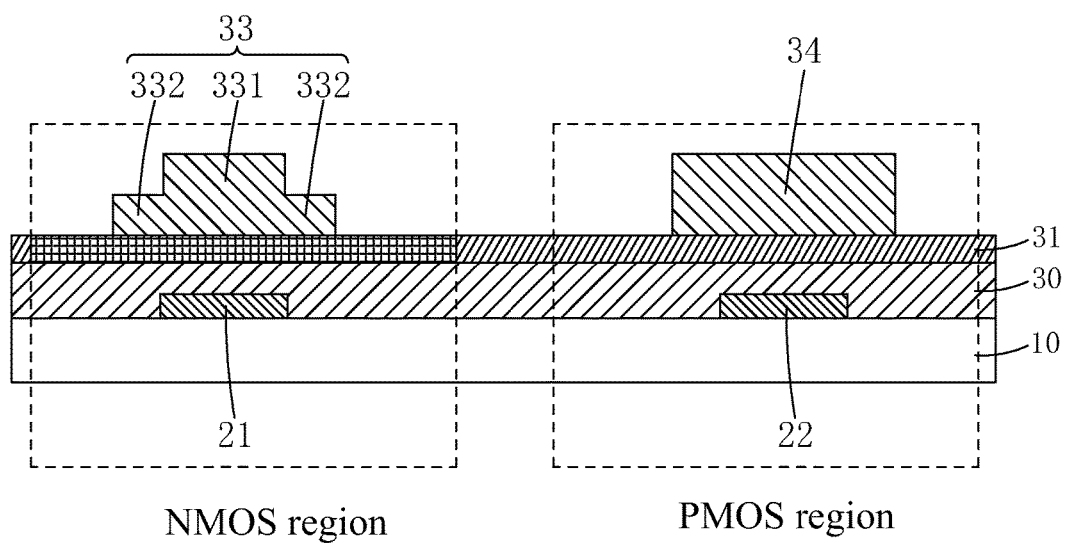
FIGS. 6A-6C are diagrams of step 3 of the manufacture method of the low temperature poly-silicon array substrate according to the present invention.
Figure 6B:
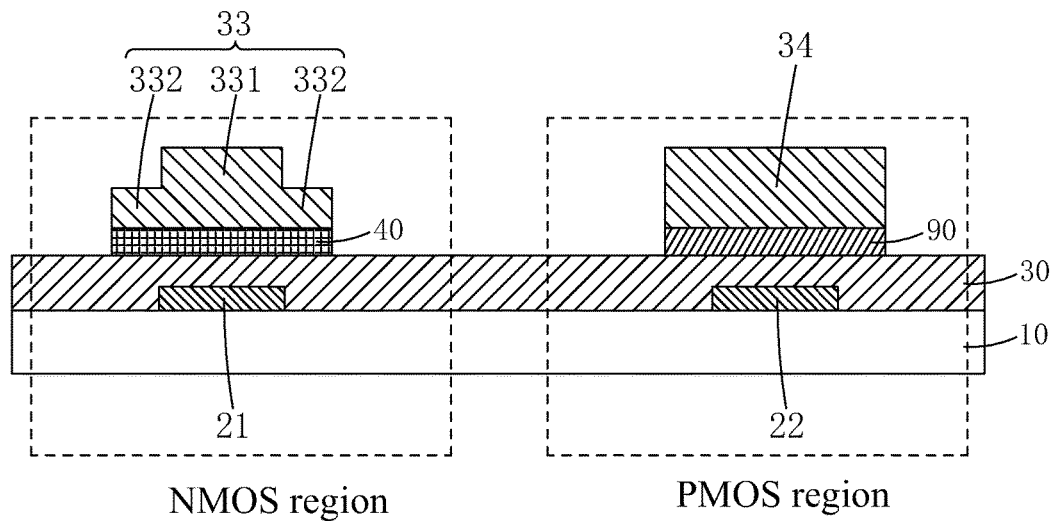
Figure 6C:
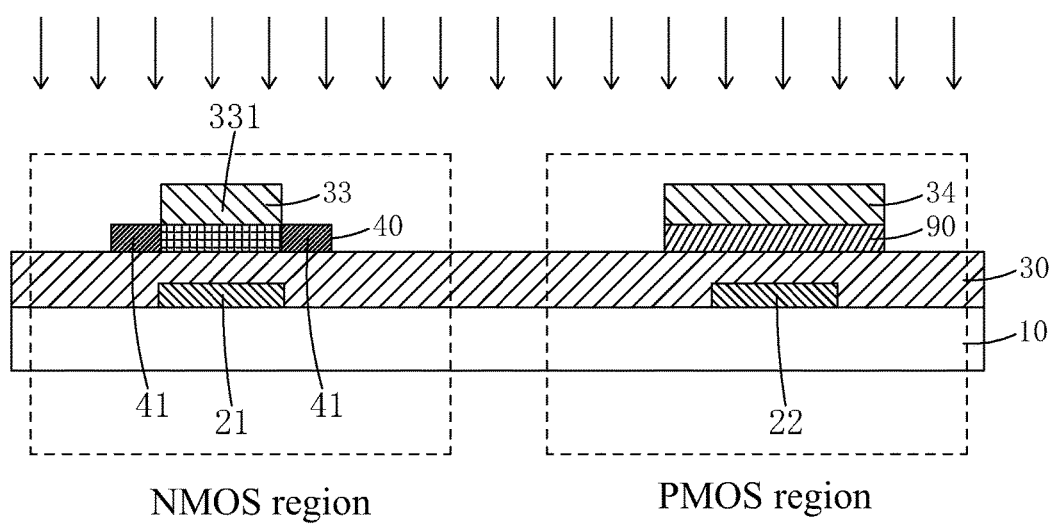

Specifically, a specific operation of channel doping is: coating a photoresist layer 32 on the polysilicon layer 31, and employing a mask to implement exposure, development to the photoresist layer 32, and after removing the photoresist layer 32 in the NMOS region, implementing P type light doping to the polysilicon layer 31 in the entire NMOS region.

step 3, as shown in FIG. 6A, coating a photoresist layer on the polysilicon layer 31, and after employing a halftone mask to implement exposure, development to the photoresist layer, a first photoresist layer 33 in the NMOS region and a second photoresist layer 34 in the PMOS region are obtained, and the first photoresist layer 33 comprises a thick layer region 331 in the middle and thin layer regions 332 at two sides of the thick layer region 331, and a thickness of the second photoresist layer 34 is uniform, and thicknesses of the thick layer region 331 of the first photoresist layer 33 and the second photoresist layer 34 are equal;

as shown in FIG. 6B, employing the first photoresist layer 33 and the second photoresist layer 34 for shielding to etch the polysilicon layer 31 to respectively obtain a first polysilicon section 40 in the NMOS region and a second polysilicon section 90 in the PMOS region;

as shown in FIG. 6C, employing a dry etching apparatus to implement ashing treatment to the first photoresist layer 33 and the second photoresist layer 34 to completely remove the thin layer regions 332 at the two sides on the first photoresist layer 33, and meanwhile, to make the thicknesses of the thick layer 331 of the first photoresist layer 33 and the second photoresist layer 34 thinner; employing remained thick layer region 331 on the first photoresist layer 33 and the second photoresist layer 34 to be a mask to implement N type heavy doping to the two sides of the first polysilicon section 40 to obtain two N type heavy doping regions 41.

Figure 7:
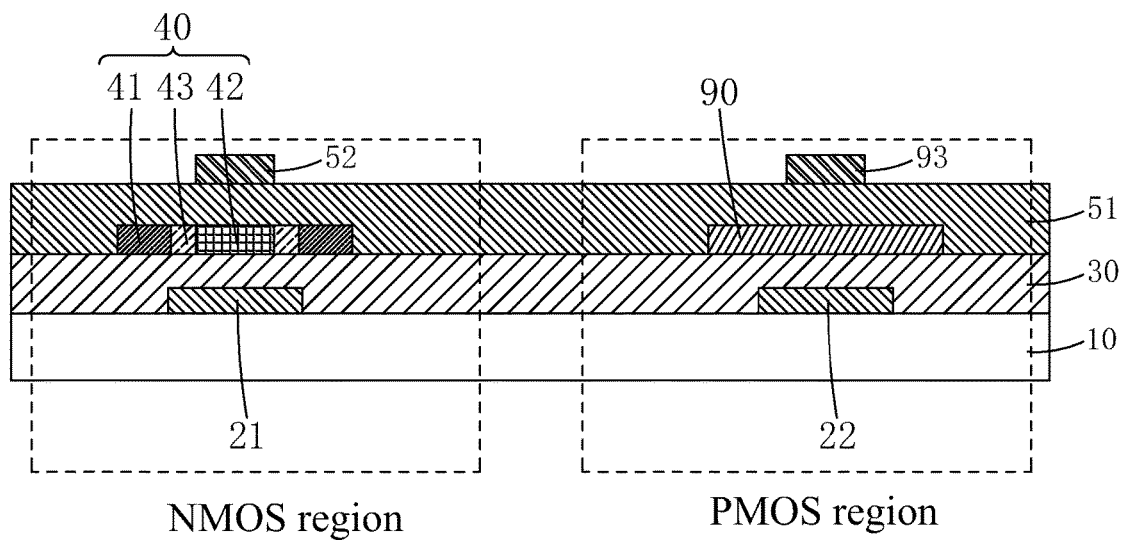
FIG. 7 is a diagram of step 4 of the manufacture method of the low temperature poly-silicon array substrate according to the present invention.
Figure 8:
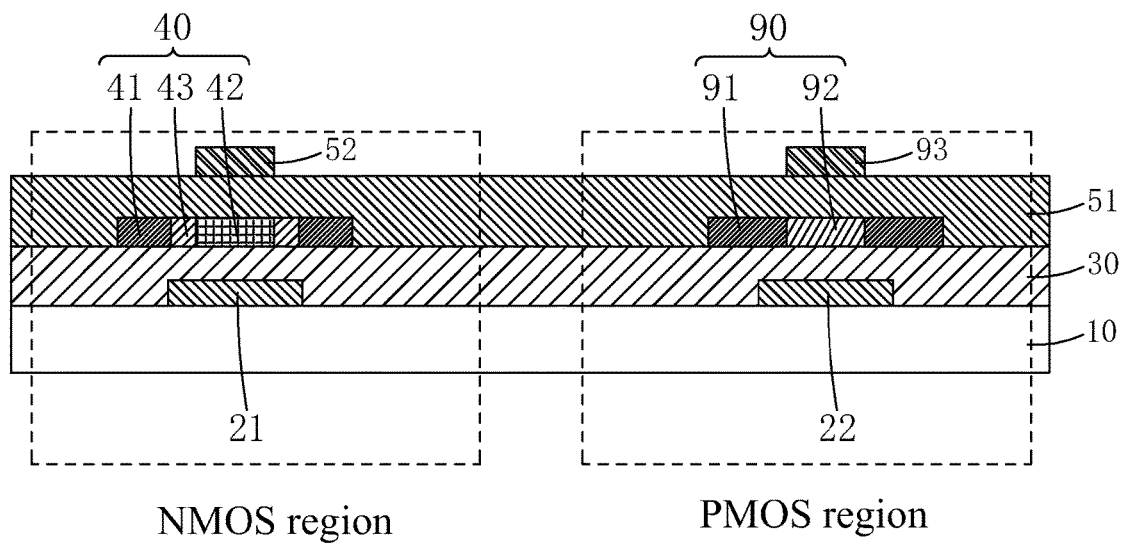
FIG. 8 is a diagram of step 5 of the manufacture method of the low temperature poly-silicon array substrate according to the present invention.
Figure 9:
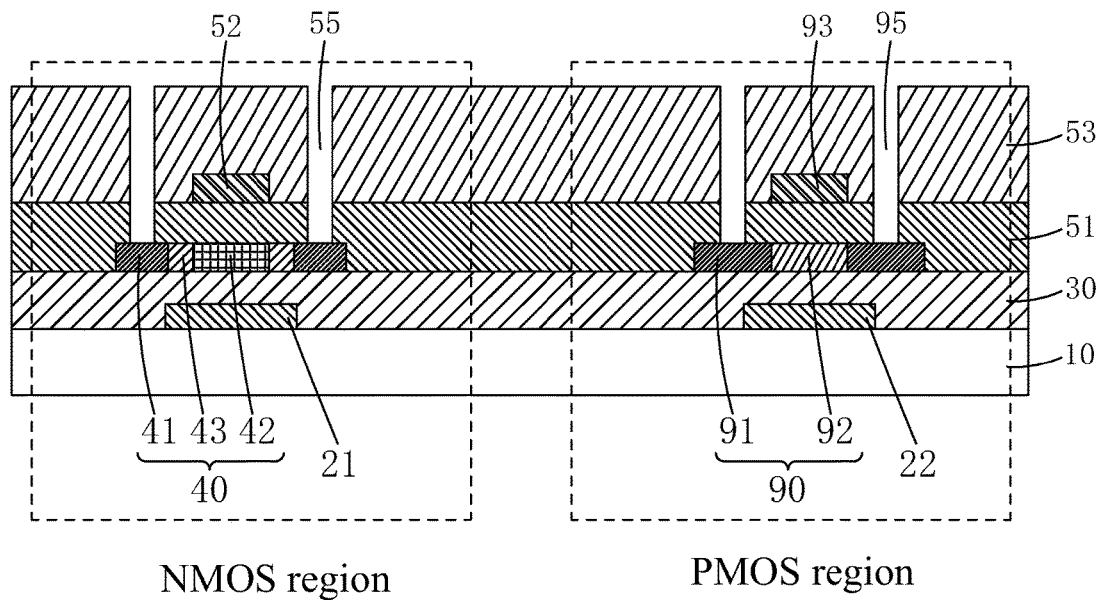
FIG. 9 is a diagram of step 6 of the manufacture method of the low temperature poly-silicon array substrate according to the present invention.

Specifically, in the step 3, a halftone mask is utilized to realize the pattern process to the polysilicon layer 31 and the N type heavy doping process of the first polysilicon section 40 of the NMOS region. In comparison with prior art, one mask is eliminated, and thus, the production cost is reduced.

step 4, as shown in FIG. 7, depositing a gate isolation layer 51 on the first polysilicon section 40, the second polysilicon section 90 and the buffer layer 30, and depositing a second metal layer on the gate isolation layer 51, and patterning the second metal layer to obtain a first gate 52 and a second gate 93 correspondingly above the first polysilicon section 40 and the second polysilicon section 90, respectively;

employing the first gate 52 to be a mask to implement N type light doping to the first polysilicon section 40 to obtain two N type light doping regions 43 respectively at inner sides of the two N type heavy doping regions 41, and a first channel region 42 is formed in a region between the two N type heavy doping regions 43 on the first polysilicon section 40.

step 5, as shown in FIG. 8, employing a mask to implement P type heavy doping to two sides of the second polysilicon section 90 to obtain two P type heavy doping regions 91, and a second channel region 92 is formed in a region between the two P type heavy doping regions 91 on the second polysilicon section 90.

step 6, as shown in FIG. 9, depositing an interlayer insulation layer 53 on the first gate 52, the second gate 93 and the gate isolation layer 51, and patterning the interlayer insulation layer 53 and the gate isolation layer 51 to obtain a first via 55 above the N type heavy doping region 41 and a second via 95 above the P type heavy doping region 91, and then implementing dehydrogenation and activation treatments to the interlayer insulation layer 53.

Figure 10:
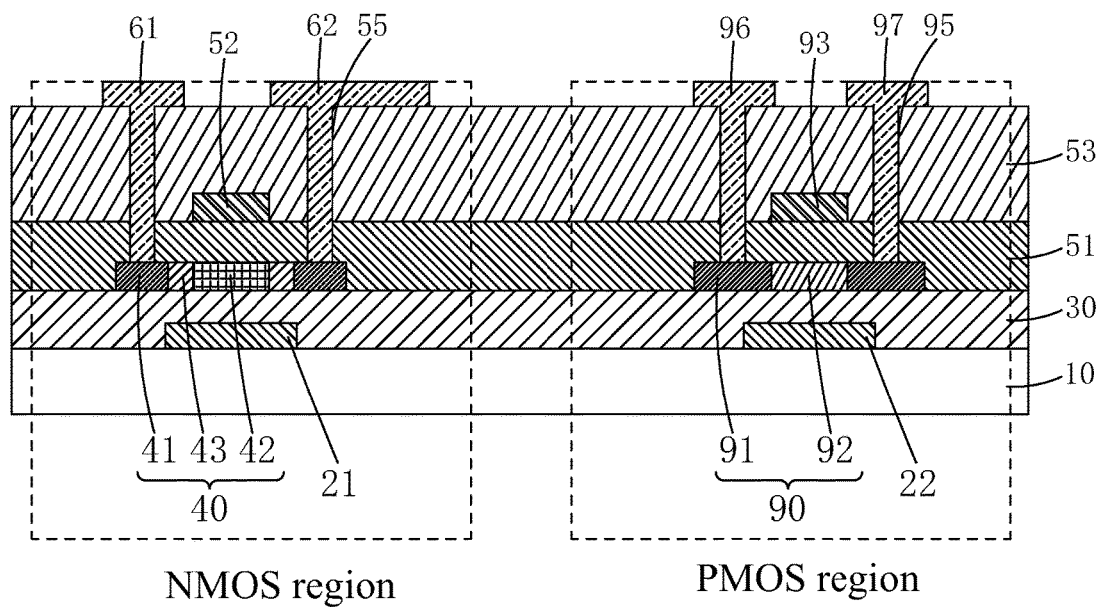
FIG. 10 is a diagram of step 7 of the manufacture method of the low temperature poly-silicon array substrate according to the present invention.
Figure 11:
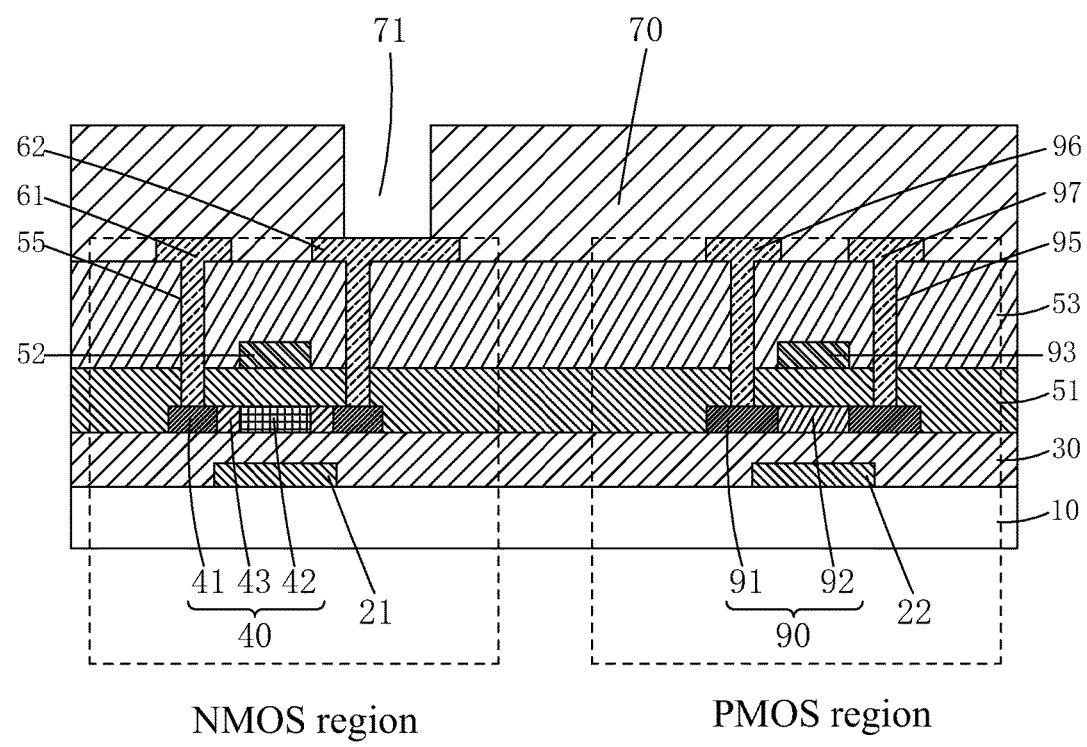
FIG. 11 is a diagram of step 8 of the manufacture method of the low temperature poly-silicon array substrate according to the present invention.
Figure 12:
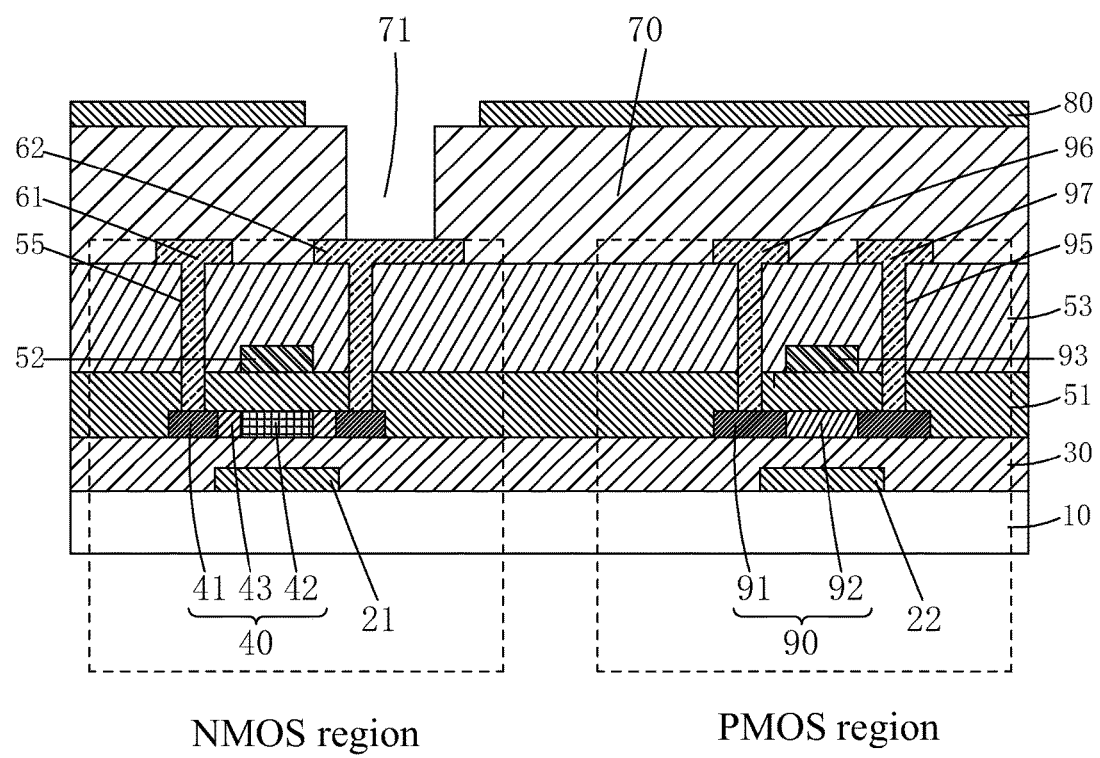
FIG. 12 is a diagram of step 9 of the manufacture method of the low temperature poly-silicon array substrate according to the present invention.
Figure 13:
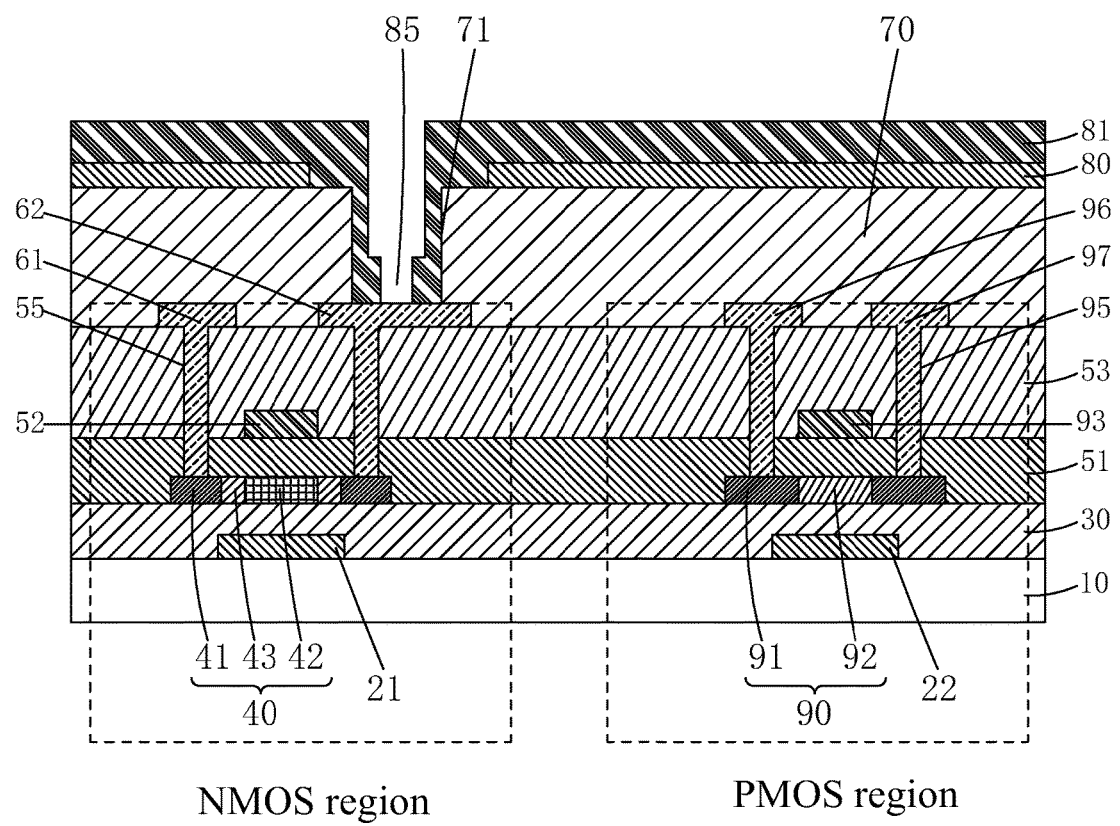
FIG. 13 is a diagram of step 10 of the manufacture method of the low temperature poly-silicon array substrate according to the present invention.
Figure 14:
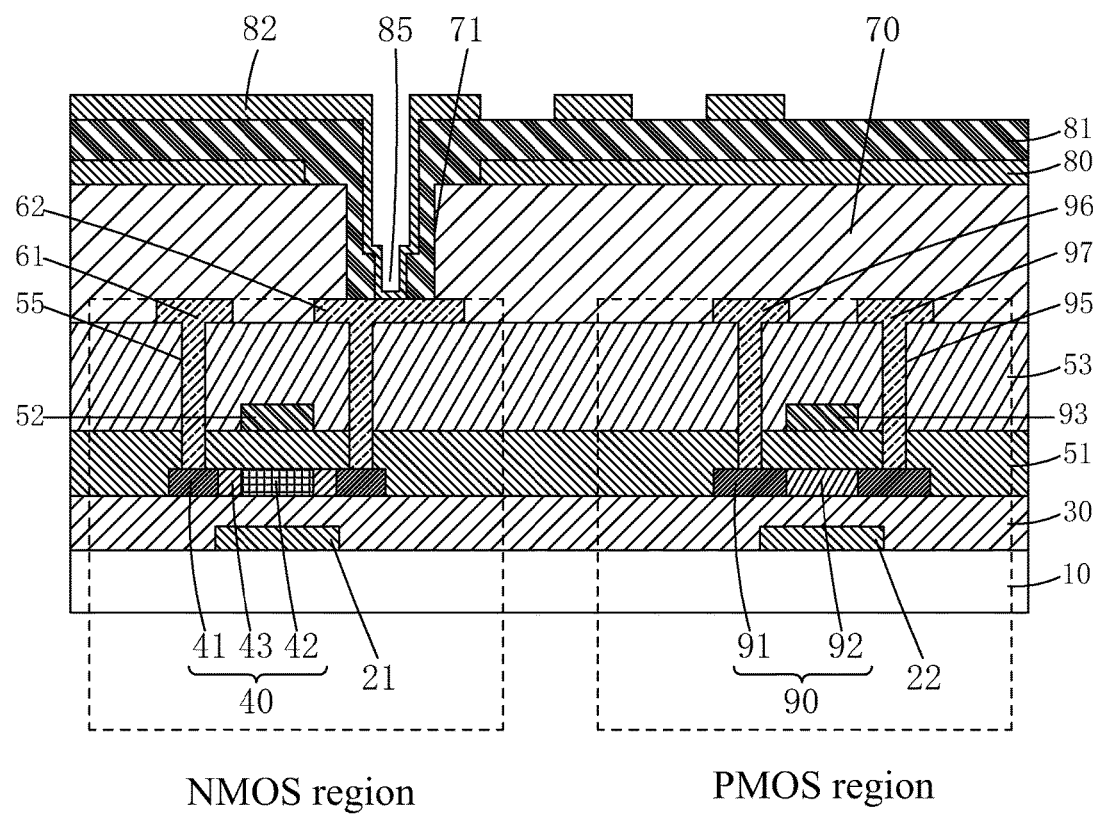
FIG. 14 is a diagram of step 11 of the manufacture method of the low temperature poly-silicon array substrate according to the present invention.

Specifically, rapid thermal annealing (RTA) is utilized to implement dehydrogenation and activation treatments to the interlayer insulation layer 53.

step 7, as shown in FIG. 10, depositing a third metal layer on the interlayer insulation layer 53, and patterning the third metal layer to obtain a first source 61, a first drain 62, a second source 96 and a second drain 97, and the first source 61 and the first drain 62 respectively contact with the N type heavy doping region 41 through the first via 55, and the second source 96 and the second rain 97 respectively contact with the P type heavy doping region 91 through the second via 95.

step 8, as shown in FIG. 11, forming a flat layer 70 on the first source 61, the first drain 62, the second source 96, the second drain 97 and the interlayer insulation layer 53, and patterning the flat layer 70 to obtain a third via 71 above the first drain 62.

step 9, as shown in FIG. 12, depositing a first transparent conductive oxide layer on the flat layer 70, and patterning the first transparent conductive oxide layer to obtain a common electrode 80.

step 10, as shown in FIG. 13, depositing a passivation protective layer 81 on the common electrode 80 and the flat layer 70, and the passivation protective layer 81 covers the third via 71 on the flat layer 70, and then patterning the passivation protective layer 81 to obtain a fourth via 85 at a bottom of the third via 71 on the passivation protective layer 81.

step 11, as shown in FIG. 14, depositing a second transparent conductive oxide layer on the passivation protective layer 81, and patterning the second transparent conductive oxide layer to obtain a pixel electrode 82, and the pixel electrode 82 contacts with the first drain 62 through the fourth via 85.

Specifically, the substrate 10 is a transparent substrate, and is preferably a glass substrate.

Specifically, a material of the first metal layer, the second metal layer and the third metal layer is a stack combination of one or more of molybdenum (Mo), titanium (Ti), aluminum (Al) and copper (Cu).

Specifically, the buffer layer 30, the gate isolation layer 51, the interlayer insulation layer 53 and the passivation protective layer 81 can be silicon oxide layers, silicon nitride layers or composite layers superimposed with silicon oxide (SiOx) layers and silicon nitride (SiNx) layers.

Specifically, a material of the flat layer 70 is an organic photoresist material.

Specifically, a material of the first transparent conductive oxide layer and the second transparent conductive oxide layer is indium tin oxide, aluminum tin oxide, aluminum zinc oxide, indium germanium zinc oxide or other proper oxides.

Specifically, the ion doped by the P type heavy doping and the P type light doping is boron ion or gallium ion.

Specifically, the ion doped by the N type heavy doping and the N type light doping is phosphorus ion or arsenic ion.

In conclusion, the present invention provides a manufacture method of a low temperature poly-silicon array substrate. A halftone mask is utilized to realize the pattern process to the polysilicon layer and the N type heavy doping process of the polysilicon section of the NMOS region. In comparison with prior art, one mask is eliminated, and thus, the production cost is reduced, and the manufactured low temperature poly-silicon array substrate possesses fine electronic property.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a low temperature poly-silicon array substrate, comprising steps of:

step 1, providing a substrate, and defining a negative-channel metal-oxide-semiconductor (NMOS) region and a positive-channel metal-oxide-semiconductor (PMOS) region on the substrate, and depositing a first metal layer on the substrate, and patterning the first metal layer to obtain a first light shielding layer in the NMOS region and a second light shielding layer in the PMOS region;

step 2, forming a buffer layer on the first light shielding layer, the second light shielding layer and the substrate, and depositing an amorphous silicon layer on the buffer layer, and employing a low temperature crystallization process to convert the amorphous silicon layer into a polysilicon layer, and employing a mask to implement a channel doping to the polysilicon layer in the NMOS region;

step 3, coating a photoresist layer on the polysilicon layer, wherein after a halftone mask is employed to implement exposure and development to the photoresist layer, a first photoresist layer in the NMOS region and a second photoresist layer in the PMOS region are obtained, and the first photoresist layer comprises a thick layer region in a middle and thin layer regions at two sides of the thick layer region, and a thickness of the second photoresist layer is uniform, and thicknesses of the thick layer region of the first photoresist layer and the second photoresist layer are equal;

employing the first photoresist layer and the second photoresist layer for shielding to etch the polysilicon layer to respectively obtain a first polysilicon section in the NMOS region and a second polysilicon section in the PMOS region;

employing a dry etching apparatus to implement ashing treatment to the first photoresist layer and the second photoresist layer to completely remove the thin layer regions at the two sides on the first photoresist layer, and meanwhile, to make the thicknesses of the thick layer region of the first photoresist layer and the second photoresist layer thinner; employing a remaining part of thick layer region on the first photoresist layer and the second photoresist layer to be a mask to implement N type heavy doping to the two sides of the first polysilicon section to obtain two N type heavy doping regions, wherein the thin layer regions of the first photoresist layer are removed before the implementation of N type heavy doping to the two sides of the first polysilicon section, while a part of the thick layer region of the first photoresist layer is preserved to serve as a mask for the implementation of N type heavy doping, the thick layer region being removed after the implementation of N type heavy doping;

step 4, depositing a gate isolation layer on the first polysilicon section, the second polysilicon section and the buffer layer, and depositing a second metal layer on the gate isolation layer, and patterning the second metal layer to obtain a first gate and a second gate correspondingly above the first polysilicon section and the second polysilicon section, respectively;

employing the first gate to be a mask to implement N type light doping to the first polysilicon section to obtain two N type light doping regions respectively at inner sides of the two N type heavy doping regions, and a first channel region is formed in a region between the two N type heavy doping regions on the first polysilicon section;

step 5, employing a mask to implement P type heavy doping to two sides of the second polysilicon section to obtain two P type heavy doping regions, and a second channel region is formed in a region between the two P type heavy doping regions on the second polysilicon section;

step 6, depositing an interlayer insulation layer on the first gate, the second gate and the gate isolation layer, and patterning the interlayer insulation layer and the gate isolation layer to obtain a first via above the N type heavy doping region and a second via above the P type heavy doping region, and then implementing dehydrogenation and activation treatments to the interlayer insulation layer;

step 7, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second rain respectively contact with the P type heavy doping region through the second via;

step 8, forming a flat layer on the first source, the first drain, the second source, the second drain and the interlayer insulation layer, and patterning the flat layer to obtain a third via above the first drain;

step 9, depositing a first transparent conductive oxide layer on the flat layer, and patterning the first transparent conductive oxide layer to obtain a common electrode;

step 10, depositing a passivation protective layer on the common electrode and the flat layer, and the passivation, protective layer covers the third via on the flat layer, and then patterning the passivation protective layer to obtain a fourth via at a bottom of the third via on the passivation protective layer; and step 11, depositing a second transparent conductive oxide layer on the passivation protective layer, and patterning the second transparent conductive oxide layer to obtain a pixel electrode, and the pixel electrode contacts with the first drain through the fourth via.

2. The manufacture method of the low temperature polysilicon array substrate according to claim 1, wherein in step 2, the low temperature crystallization process is one of excimer laser annealing and metal-Induced lateral crystallization.

3. The manufacture method of the low temperature polysilicon array substrate according to claim 1, wherein in step 2, an operation of channel doping is: coating a photoresist layer on the polysilicon layer, and employing a mask to implement exposure and development to the photoresist layer, and after removing the photoresist layer in the NMOS region, implementing P type light doping to the polysilicon layer in the entire NMOS region.

4. The manufacture method of the low temperature polysilicon array substrate according to claim 1, wherein in step 6, rapid thermal annealing is employed to implement the dehydrogenation and activation treatments to the interlayer insulation layer.

5. The manufacture method of the low temperature polysilicon array substrate according to claim 1, wherein the substrate is a glass substrate; a material of the first metal layer, the second metal layer and the third metal layer is a stack combination of one or more of molybdenum, titanium, aluminum and copper; the buffer layer, the gate isolation layer, the interlayer insulation layer and the passivation protective layer are silicon oxide layers, silicon nitride layers or composite layers superimposed with silicon oxide layers and silicon nitride layers; the flat layer is an organic photoresist material.

6. The manufacture method of the low temperature polysilicon array substrate according to claim 1, wherein a material of the first transparent conductive oxide layer and the second transparent conductive oxide layer is a metal oxide.

7. The manufacture method of the low temperature polysilicon array substrate according to claim 6, wherein the metal oxide is one of indium tin oxide, aluminum tin oxide, aluminum zinc oxide and indium germanium zinc oxide.

8. The manufacture method of the low temperature polysilicon array substrate according to claim 1, wherein the ion doped by the N type heavy doping and the N type light doping is phosphorus ion or arsenic ion.

9. The manufacture method of the low temperature polysilicon array substrate according to claim 3, wherein the ion doped by the P type heavy doping and the P type light doping is boron ion or gallium ion.

10. A manufacture method of a low temperature polysilicon array substrate, comprising steps of:

step 1, providing a substrate, and defining a negative-channel metal-oxide-semiconductor (NMOS) region and a positive-channel metal-oxide-semiconductor (PMOS) region on the substrate, and depositing a first metal layer on the substrate, and patterning the first metal layer to obtain a first light shielding layer in the NMOS region and a second light shielding layer in the PMOS region;

step 2, forming a buffer layer on the first light shielding layer, the second light shielding layer and the substrate, and depositing an amorphous silicon layer on the buffer layer, and employing a low temperature crystallization process to convert the amorphous silicon layer into a polysilicon layer, and employing a mask to implement a channel doping to the polysilicon layer in the NMOS region;

step 3, coating a photoresist layer on the polysilicon layer, wherein after a halftone mask is employed to implement exposure and development to the photoresist layer, a first photoresist layer in the NMOS region and a second photoresist layer in the PMOS region are obtained, and the first photoresist layer comprises a thick layer region in a middle and thin layer regions at two sides of the thick layer region, and a thickness of the second photoresist layer is uniform, and thicknesses of the thick layer region of the first photoresist layer and the second photoresist layer are equal;

employing the first photoresist layer and the second photoresist layer for shielding to etch the polysilicon layer to respectively obtain a first polysilicon section in the NMOS region and a second polysilicon section in the PMOS region;

employing a dry etching apparatus to implement ashing treatment to the first photoresist layer and the second photoresist layer to completely remove the thin layer regions at the two sides on the first photoresist layer, and meanwhile, to make the thicknesses of the thick layer region of the first photoresist layer and the second photoresist layer thinner; employing a remaining part of thick layer region on the first photoresist layer and the second photoresist layer to be a mask to implement N type heavy doping to the two sides of the first polysilicon section to obtain two N type heavy doping regions, wherein the thin layer regions of the first photoresist layer are removed before the implementation of N type heavy doping to the two sides of the first polysilicon section, while a part of the thick layer region of the first photoresist layer is preserved to serve as a mask for the implementation of N type heavy doping, the thick layer region being removed after the implementation of N type heavy doping;

step 4, depositing a gate isolation layer on the first polysilicon section, the second polysilicon section and the buffer layer, and depositing a second metal layer on the gate isolation layer, and patterning the second metal layer to obtain a first gate and a second gate correspondingly above the first polysilicon section and the second polysilicon section, respectively;

employing the first gate to be a mask to implement N type light doping to the first polysilicon section to obtain two N type light doping regions respectively at inner sides of the two N type heavy doping regions, and a first channel region is formed in a region between the two N type heavy doping regions on the first polysilicon section;

step 5, employing a mask to implement P type heavy doping to two sides of the second polysilicon section to obtain two P type heavy doping regions, and a second channel region is formed in a region between the two P type heavy doping regions on the second polysilicon section;

step 6, depositing an interlayer insulation layer on the first gate, the second gate and the gate isolation layer, and patterning the interlayer insulation layer and the gate isolation layer to obtain a first via above the N type heavy doping region and a second via above the P type heavy doping region, and then implementing dehydrogenation and activation treatments to the interlayer insulation layer;

step 7, depositing a third metal layer on the interlayer insulation layer, and patterning the third metal layer to obtain a first source, a first drain, a second source and a second drain, and the first source and the first drain respectively contact with the N type heavy doping region through the first via, and the second source and the second rain respectively contact with the P type heavy doping region through the second via;

step 8, forming a flat layer on the first source, the first drain, the second source, the second drain and the interlayer insulation layer, and patterning the flat layer to obtain a third via above the first drain;

step 9, depositing a first transparent conductive oxide layer on the flat layer, and patterning the first transparent conductive oxide layer to obtain a common electrode;

step 10, depositing a passivation protective layer on the common electrode and the flat layer, and the passivation protective layer covers the third via on the flat layer, and then patterning the passivation protective layer to obtain a fourth via at a bottom of the third via on the passivation protective layer;

step 11, depositing a second transparent conductive oxide layer on the passivation protective layer, and patterning the second transparent conductive oxide layer to obtain a pixel electrode, and the pixel electrode contacts with the first drain through the fourth via;

wherein in step 2, the low temperature crystallization process is one of excimer laser annealing and metal-Induced lateral crystallization; and wherein in step 2, an operation of channel doping is: coating a photoresist layer on the polysilicon layer, and employing a mask to implement exposure and development to the photoresist layer, and after removing the photoresist layer in the NMOS region, implementing P type light doping to the polysilicon layer in the entire NMOS region.

11. The manufacture method of the low temperature poly-silicon array substrate according to claim 10, wherein in step 6, rapid thermal annealing is employed to implement the dehydrogenation and activation treatments to the interlayer insulation layer.

12. The manufacture method of the low temperature poly-silicon array substrate according to claim 10, wherein the substrate is a glass substrate; a material of the first metal layer, the second metal layer and the third metal layer is a stack combination of one or more of molybdenum, titanium, aluminum and copper; the buffer layer, the gate isolation layer, the interlayer insulation layer and the passivation protective layer are silicon oxide layers, silicon nitride layers or composite layers superimposed with silicon oxide layers and silicon nitride layers; the flat layer is an organic photoresist material.

13. The manufacture method of the low temperature poly-silicon array substrate according to claim 10, wherein a material of the first transparent conductive oxide layer and the second transparent conductive oxide layer is a metal oxide.

14. The manufacture method of the low temperature poly-silicon array substrate according to claim 13, wherein the metal oxide is one of indium tin oxide, aluminum tin oxide, aluminum zinc oxide and indium germanium zinc oxide.

15. The manufacture method of the low temperature poly-silicon array substrate according to claim 10, wherein the ion doped by the N type heavy doping and the N type light doping is phosphorus ion or arsenic ion.

16. The manufacture method of the low temperature poly-silicon array substrate according to claim 10, wherein the ion doped by the P type heavy doping and the P type light doping is boron ion or gallium ion.

* * * * *